(12) United States Patent
Wu et al.

(10) Patent No.: US 11,189,811 B2
(45) Date of Patent: Nov. 30, 2021

(54) ORGANIC LIGHT EMITTING DIODE DISPLAY PANEL HAVING WIDE COLOR GAMUT AND LOW POWER CONSUMPTION, MANUFACTURING METHOD THEREOF, AND DISPLAY DEVICE

(71) Applicant: BOE TECHNOLOGY GROUP CO., LTD., Beijing (CN)

(72) Inventors: Chang Yen Wu, Beijing (CN); Youngsuk Song, Beijing (CN); Wenfeng Song, Beijing (CN); Wei Li, Beijing (CN); Chun I Lin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 473 days.

(21) Appl. No.: 16/098,326

(22) PCT Filed: Apr. 11, 2018

(86) PCT No.: PCT/CN2018/082695
§ 371 (c)(1),
(2) Date: Nov. 1, 2018

(87) PCT Pub. No.: WO2018/233353
PCT Pub. Date: Dec. 27, 2018

(65) Prior Publication Data
US 2021/0098730 A1    Apr. 1, 2021

(30) Foreign Application Priority Data

Jun. 20, 2017    (CN) .......................... 201710469604.4

(51) Int. Cl.
*H01L 29/08*    (2006.01)
*H01L 51/50*    (2006.01)
(Continued)

(52) U.S. Cl.
CPC .......... *H01L 51/504* (2013.01); *H01L 27/322* (2013.01); *H01L 51/5016* (2013.01);
(Continued)

(58) Field of Classification Search
CPC combination set(s) only.
See application file for complete search history.

(56) References Cited

U.S. PATENT DOCUMENTS 7,365,488 B2 * 4/2008 Lee .................... H01L 51/5218
                                                    313/506
7,808,585 B2   10/2010 Haga et al.
(Continued)

FOREIGN PATENT DOCUMENTS

CN    1711002 A    12/2005
CN    1985196 A    6/2007
(Continued)

OTHER PUBLICATIONS

First Chinese Office Action in Chinese Application No. 201710469604.4 dated Mar. 26, 2020.
(Continued)

*Primary Examiner* — Caleb E Henry
(74) *Attorney, Agent, or Firm* — Dilworth & Barrese, LLP.; Michael J. Musella, Esq.

(57) ABSTRACT

An organic light emitting diode display panel, a manufacturing method thereof, and a display device are disclosed. The organic light emitting diode display panel includes: a base substrate; a light emitting layer on the base substrate, a spectral width at 10%-15% of a maximum spectral intensity of an emission spectrum of the light emitting layer is not less than 200 nm, and a yellow-green wave band of the emission spectrum includes at least one peak located between 550 nm-562 nm.

16 Claims, 2 Drawing Sheets

(51) Int. Cl.
*H01L 27/32* (2006.01)
*H01L 51/56* (2006.01)

(52) U.S. Cl.
CPC ...... *H01L 51/56* (2013.01); *H01L 2251/5376* (2013.01); *H01L 2251/558* (2013.01)

(56) References Cited

U.S. PATENT DOCUMENTS

| | | | |
|---|---|---|---|
| 9,680,119 | B2 | 6/2017 | Park et al. |
| 9,905,789 | B2* | 2/2018 | Gu .......................... C09K 11/08 |
| 2011/0095276 | A1 | 4/2011 | Imai et al. |
| 2012/0161114 | A1 | 6/2012 | Kim et al. |
| 2013/0134461 | A1 | 5/2013 | Chen et al. |
| 2015/0325803 | A1* | 11/2015 | Lee .................... H01L 51/0096 257/40 |
| 2016/0079556 | A1 | 3/2016 | Yoo et al. |
| 2016/0240821 | A1* | 8/2016 | Carroll .................. H01L 33/42 |
| 2017/0261788 | A1* | 9/2017 | Cheng ................ H01L 27/1262 |
| 2017/0269274 | A1* | 9/2017 | Cheng ................. G02B 5/3041 |
| 2018/0090709 | A1* | 3/2018 | Meng .................. H01L 51/5221 |
| 2018/0156954 | A1* | 6/2018 | Cheng .................... G02F 1/017 |
| 2018/0166519 | A1* | 6/2018 | Kim .................... H01L 51/5284 |
| 2018/0366673 | A1* | 12/2018 | Xie ........................ H01L 51/56 |

FOREIGN PATENT DOCUMENTS

| | | |
|---|---|---|
| CN | 101368096 A | 2/2009 |
| CN | 101403831 A | 4/2009 |
| CN | 102842273 A | 12/2012 |
| CN | 104716264 A | 6/2015 |
| CN | 105552239 A | 5/2016 |
| CN | 106356464 A | 1/2017 |
| EP | 2846372 A1 | 3/2015 |
| JP | 2003279955 A | 10/2003 |
| JP | 2005150078 A | 6/2005 |
| JP | 2007012370 A | 1/2007 |
| JP | 2007103028 A | 4/2007 |
| JP | 2012182126 A | 9/2012 |
| JP | 2014225415 A | 12/2014 |

OTHER PUBLICATIONS

International Search Report and Written Opinion dated Jun. 27 2018 from State Intellectual Property Office of the P.R. China.
Extended European Search Report from European Patent Application 18793351.0 dated Feb. 12, 2021.
First Japanese Office Action from Japanese Patent Application No. 2018-558429 dated Oct. 4, 2021.

* cited by examiner

ORGANIC LIGHT EMITTING DIODE DISPLAY PANEL HAVING WIDE COLOR GAMUT AND LOW POWER CONSUMPTION, MANUFACTURING METHOD THEREOF, AND DISPLAY DEVICE

The present application claims priority of China Patent application No. 201710469604.4 filed on Jun. 20, 2017, the content of which is incorporated in its entirety as portion of the present application by reference herein.

TECHNICAL FIELD

At least one embodiment of the present disclosure relates to an organic light emitting diode display panel, a manufacturing method thereof, and a display device.

BACKGROUND

An organic light emitting diode (OLED) device is a new type of flat panel display device, which is a kind of self-luminous display device with a series of advantages such as all solid-state structure, high brightness, full viewing angle, fast response speed, and flexible display. Thus, organic light emitting diode devices have become the next generation of display devices with great competitiveness and development prospects.

A white organic light emitting diode (WOLED) belongs to a surface light source, can be used to manufacture a large-sized, arbitrary-shaped flat light source, and is suitable for a backlight of a liquid crystal display device and a full-color organic light emitting diode display device. Generally, the WOLED light emitting diode device can be combined with a color filter (CF) to achieve full color of an organic light emitting diode display device.

SUMMARY

At least one embodiment of the present disclosure provides an organic light emitting diode display panel, a manufacturing method thereof, and a display device. The organic light emitting diode display panel simultaneously has wide color gamut and low power consumption.

At least one embodiment of the present disclosure provides an organic light emitting diode display panel, the organic light emitting diode display panel includes a base substrate and a light emitting layer on the base substrate, a spectral width at 10%-15% of a maximum spectral intensity of an emission spectrum of the light emitting layer is not less than 200 nm, and a yellow-green wave band of the emission spectrum includes at least one peak located between 550 nm-562 nm.

In an example of the present disclosure, the organic light emitting diode display panel further includes: a color filter layer on a side of the light emitting layer away from the base substrate and on a light exit side of the light emitting layer, and including color filter elements of at least three colors. A color filter element of one color is configured to only transmit light having a wavelength greater than 580 nm, and have a transmittance greater than 50% for light having a wavelength of 595 nm.

In an example of the present disclosure, the emission spectrum includes at least three peaks.

In an example of the present disclosure, the yellow-green wave band of the emission spectrum only includes one peak located between 550 nm-562 nm, and the peak located between 550 nm-562 nm is a first peak.

In an example of the present disclosure, a peak at the maximum spectral intensity of the emission spectrum is a second peak, and a peak wavelength of the second peak is not greater than 456 nm.

In an example of the present disclosure, a trough value of a trough between the first peak and the second peak is between 15%-30% of a peak value of the second peak.

In an example of the present disclosure, a red wave band of the emission spectrum includes a third peak, and a peak wavelength of the third peak is between 610 nm-624 nm.

In an example of the present disclosure, a ratio of a peak value of the first peak to a peak value of the third peak is greater than 1.5:1, and a wavelength difference between the peak wavelength of the third peak and a peak wavelength of the first peak is less than 70 nm.

In an example of the present disclosure, the light emitting layer includes three laminated layers.

In an example of the present disclosure, the three laminated layers include a first blue light emitting layer, a red and green light emitting layer, and a second blue light emitting layer.

In an example of the present disclosure, the first blue light emitting layer has a thickness of 150-300 nm, and the red and green light emitting layer has a thickness of 60-100 nm, and the second blue light emitting layer has a thickness of 100-200 nm.

In an example of the present disclosure, the first blue light emitting layer and the second blue light emitting layer each include a fluorescent material, and the red and green light emitting layer includes a phosphorescent material.

In an example of the present disclosure, the organic light emitting diode display panel includes a red pixel, a green pixel, a blue pixel, and a white pixel, and the color filter elements of the at least three colors include a red color filter element, a green color filter element, and a blue color filter element, which are disposed in the red pixel, the green pixel, and the blue pixel, respectively.

In an example of the present disclosure, the light emitting layer is a white light emitting layer.

At least one embodiment of the present disclosure provides a manufacturing method of an organic light emitting diode display panel, including: forming a light emitting layer on a base substrate, a spectral width at 10%-15% of a maximum spectral intensity of an emission spectrum of the light emitting layer is not less than 200 nm, and a yellow-green wave band of the emission spectrum includes at least one peak located between 550 nm-562 nm.

In an example of the present disclosure, the manufacturing method of the organic light emitting diode further includes: forming a color filter layer on a side of the light emitting layer away from the base substrate. The color filter layer is located on a light exit side of the light emitting layer and includes color filter elements of at least three colors. The color filter element of one color is configured to only transmit light having a wavelength greater than 580 nm, and have a transmittance greater than 50% for light having a wavelength of 595 nm.

In an example of the present disclosure, the yellow-green wave band of the emission spectrum only includes one peak located between 550 nm-562 nm.

At least one embodiment of the present disclosure provides a display device, including the organic light emitting diode display panel according to any one of the abovementioned examples.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

Figure 1:
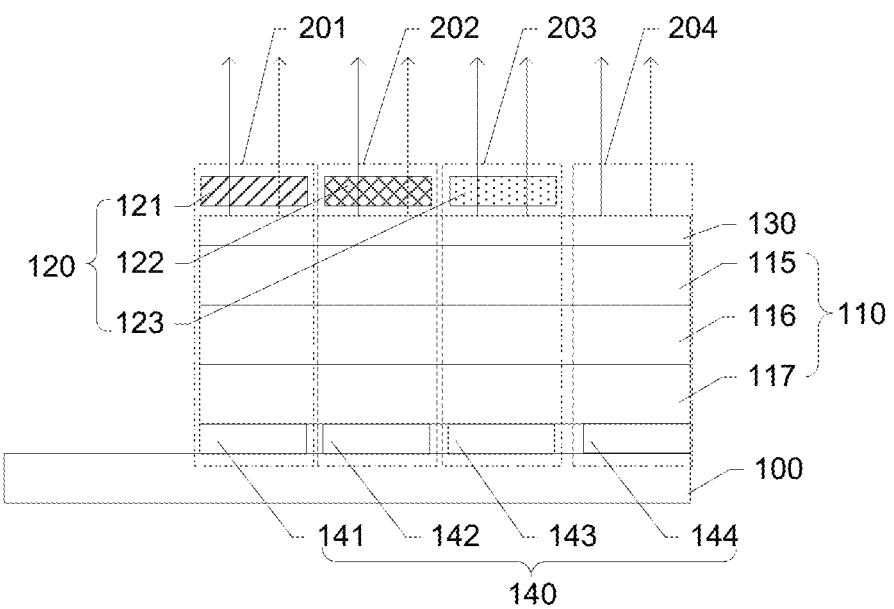
FIG. 1 is a schematic diagram of an organic light emitting diode display panel provided by an embodiment of the present disclosure.

Drawing references: 100—base substrate; 110—light emitting layer; 111—peak at maximum spectral intensity (second peak); 112—first peak; 113—third peak; 114—trough; 115—first blue light emitting layer; 116—red and green light emitting layer; 117—second blue light emitting layer; 120—color filter layer; 121—first color filter element; 122—second color filter element; 123—third color filter element; 130—first electrode; 140—second electrode; 141—first sub electrode; 142—second sub electrode; 143—third sub electrode; 144—fourth sub electrode; 201—red pixel; 202—green pixel; 203—blue pixel; 204—white pixel.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In research, the inventor(s) of the present application notices that: upon the color gamut of an organic light emitting diode display panel being increased, the power consumption thereof is usually greatly affected, that is, the increase of the color gamut of the organic light emitting diode display panel easily leads to the increase of the power consumption thereof. Therefore, wide color gamut and low power consumption of an organic light emitting diode display panel are difficult to achieve at the same time.

Embodiments of the present disclosure provide an organic light emitting diode display panel, a manufacturing method thereof, and a display device. The organic light emitting diode display panel includes a base substrate and a light emitting layer on the base substrate, a spectral width at 10%-15% of a maximum spectral intensity of an emission spectrum of the light emitting layer is not less than 200 nm, and a yellow-green wave band of the emission spectrum includes at least one peak located between 550 nm-562 nm. The organic light emitting diode display panel simultaneously has wide color gamut and low power consumption.

Hereinafter, the organic light emitting diode display panel, the manufacturing method thereof, and the display device provided by the embodiments of the present disclosure will be described with reference to the accompanying drawings.

Figure 2:
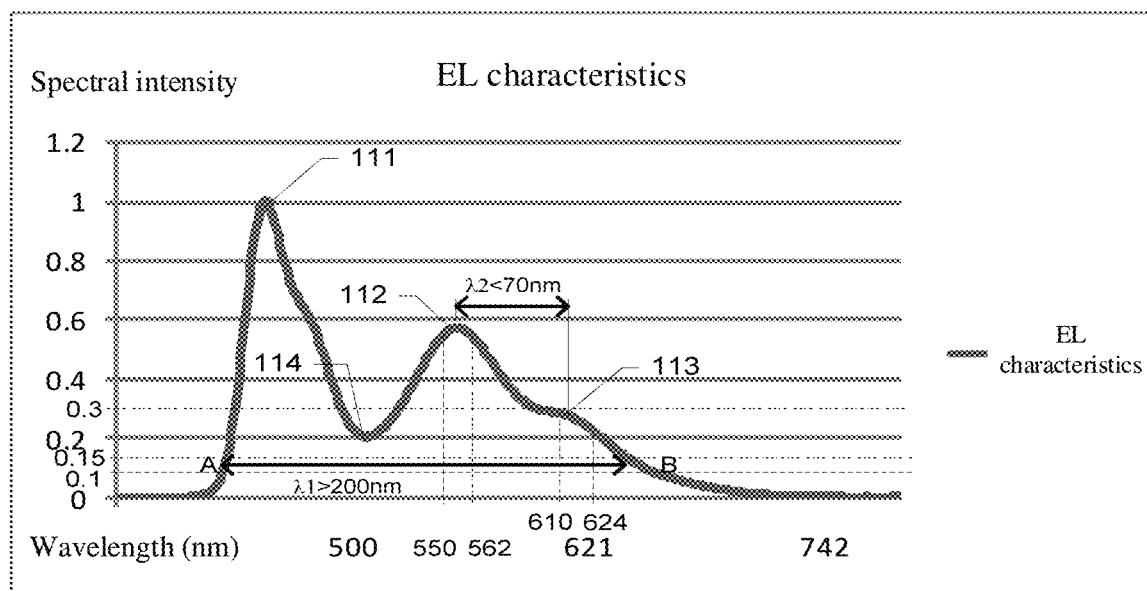
FIG. 2 is a diagram of an emission spectrum of the organic light emitting diode display panel shown in FIG. 1.

An embodiment of the present disclosure provides an organic light emitting diode display panel. FIG. 1 is a schematic diagram of an organic light emitting diode display panel provided by the present embodiment, and FIG. 2 is a diagram of an emission spectrum of the organic light emitting diode display panel illustrated by FIG. 1. As illustrated by FIG. 1, the organic light emitting diode display panel provided by the present embodiment includes a base substrate 100 and a light emitting layer 110 on the base substrate 100. As illustrated by FIG. 2, a spectral width at 10%-15% of a peak value of a peak 111 at a maximum spectral intensity of an emission spectrum of the light emitting layer 110 is not less than 200 nm. As can be seen from FIG. 2, a spectral width at 10% of a peak value of the peak 111 at the maximum spectral intensity is greater than a spectral width at 15% of the peak value of the peak 111 at the maximum spectral intensity. Thus, in the present embodiment, a wavelength interval λ1 between two points A and B of a spectrum line which respectively correspond to 15% of the maximum spectral intensity of the spectrum line is greater than 200 nm. The spectrum emitted by the light emitting layer 110 provided by the present embodiment has wide spectral characteristics, so that the organic light emitting diode display panel including the light emitting layer has wide color gamut.

As illustrated by FIG. 2, a yellow-green wave band of the emission spectrum includes at least one peak between 550 nm and 562 nm. The yellow-green wave band approximately covers a wavelength range from 500 nm to 600 nm. The yellow-green wave band of the spectrum provided by the present embodiment includes at least one peak between 550 nm and 562 nm. The present embodiment is described by taking a case where the yellow-green wave band of the emission spectrum includes only one peak located between 550 nm and 562 nm, but the present embodiment is not limited thereto. A wavelength corresponding to the position of the peak is close to a wavelength corresponding to a peak of the human visual curve. Therefore, green light emitted by the organic light emitting diode display panel can have higher luminous efficiency. Herein, "luminous efficiency" mainly refers to current efficiency, i.e., luminous brightness at a unit current.

For example, upon a peak wavelength of the peak being shifted to the left (i.e., a value of the wavelength is decreased), the current efficiency of the organic light emitting diode display panel provided by the embodiment is decreased, and the power consumption is increased. Herein, "power consumption" includes power consumption of the display panel in a white image (White Power) and the maximum power consumption (Worst Power). For example, upon the peak wavelength of the peak being shifted to the right (i.e., the value of the wavelength is increased), the color gamut of the organic light emitting diode display panel provided by the present embodiment is decreased.

For example, as illustrated by FIG. 2, the peak wavelength of the peak 111 at the maximum spectral intensity is not greater than 456 nm, that is, the peak 111 at the maximum spectral intensity in the emission spectrum is located in a wave band of deep blue light, so that the organic light emitting diode display panel has wider color gamut.

For example, as illustrated by FIG. 1, the organic light emitting diode display panel provided by the present embodiment further includes a color filter layer 120, the color filter layer 120 is located on a side of the light emitting layer 110 away from the base substrate 100, and the color filter layer 120 is located on a light exit side of the organic light emitting diode display panel. A structure of the organic light emitting diode display panel of the present embodiment is a structure in which a white organic light emitting diode (WOLED) and a color filter layer (CF, Color Filter) are combined. The light emitting layer in the present embodiment is configured to emit white light. The color filter layer 120 includes color filter elements of at least three colors. The present embodiment is described by taking a case where the color filter layer 120 includes color filter elements of three colors as an example, but is not limited thereto.

For example, as illustrated by FIG. 1, the color filter layer 120 includes a first color filter element 121, a second color filter element 122, and a third color filter element 123. The present embodiment includes but is not limited thereto.

For example, as illustrated by FIG. 1, the present embodiment is described by taking a case where the organic light emitting diode display panel includes a red pixel 201, a green pixel 202, a blue pixel 203, and a white pixel 204 (each pixel circled by a dotted line in the figure) as an example, but is not limited thereto, pixels of other colors may also be included.

For example, the first color filter element 121 included in the color filter layer 120 in the present embodiment may be a red color filter element, the second color filter element 122 may be a green color filter element, and the third color filter element 123 may be a blue color filter element. The color filter elements of the three colors are respectively disposed in the red pixel 201, the green pixel 202, and the blue pixel 203. The present embodiment includes but is not limited thereto.

Figure 3:
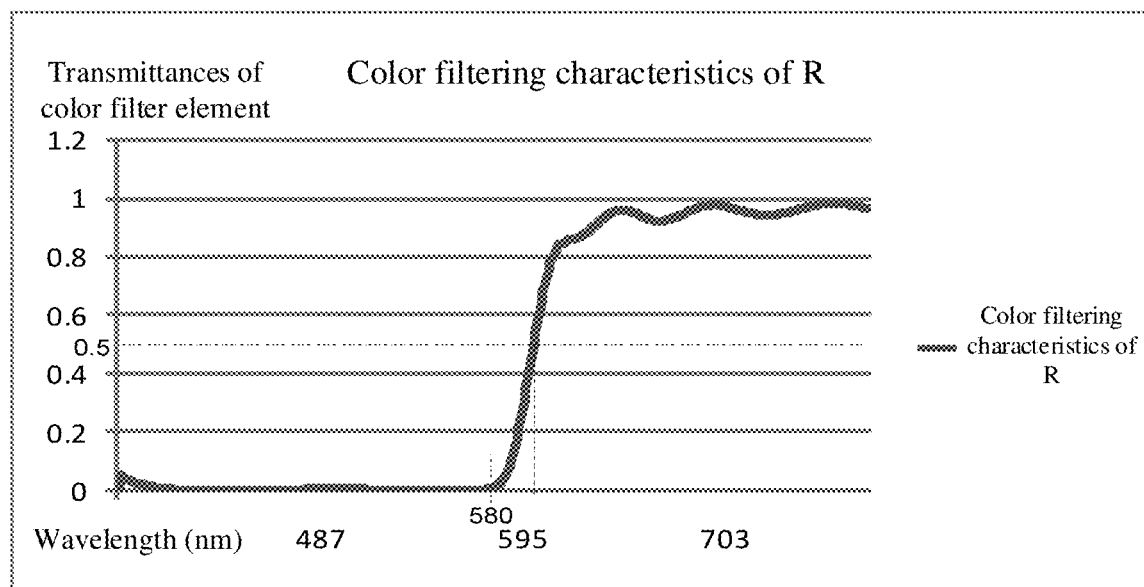
FIG. 3 is a schematic diagram of filtering characteristics of a color filter element of one color in a color filter layer provided by an embodiment of the present disclosure.

For example, FIG. 3 is a schematic diagram of filter characteristics of a color filter element of one color in a color filter layer provided by the present embodiment. As illustrated by FIG. 3, a color filter element of one color is configured to only transmit light having a wavelength greater than 580 nm, that is, the position of the wavelength of 580 nm is an onset for the increase from zero in transmittance of the color filter elements for light of different wavelengths emitted by the light emitting layer. Upon white light having different wavelengths emitted by the light emitting layer passing through the color filter elements, light having a wavelength less than or equal to 580 nm can hardly pass through the color filter elements, and light having a wavelength greater than 580 nm can pass through the color filter elements. It can be seen from the wavelength range which can be transmitted by the color filter elements that: the color filter elements are color filter elements (i.e., red color filter elements) that can transmit light having the longest wavelength (i.e., red light). In addition, as illustrated by FIG. 3, the color filter elements also need to satisfy that a transmittance for the light having a wavelength of 595 nm is greater than 50%. Therefore, the red light emitted by the organic light emitting diode display panel having the color filter elements has higher luminous efficiency (current efficiency), the color filter elements can also make the organic light emitting diode display panel provided by the present embodiment have wider color gamut.

The organic light emitting diode display panel provided by the present embodiment adopts a structure including the light emitting layer having the emission spectrum as illustrated by FIG. 1 and the color filter elements having a special spectral setting as illustrated by FIG. 3, so as to achieve wide color gamut by adjusting blue light and red light. Besides, the organic light emitting display panel can make the luminous efficiency of the white pixels in the organic light emitting display panel (WOLED) higher by adjusting green light and red light, thereby reducing the power consumption of the display panel.

For example, as illustrated by FIG. 2, the emission spectrum includes at least three peaks, and the present embodiment is described by taking a case where the emission spectrum includes three peaks as an example, but is not limited thereto.

For example, as illustrated by FIG. 2, the yellow-green wave band of the emission spectrum includes only one peak between 550 nm and 562 nm, and the peak between 550 nm and 562 nm is the first peak 112.

For example, as illustrated by FIG. 2, the peak 111 at the maximum spectral intensity of the emission spectrum is the second peak 111. For example, a trough value of a trough 114 between the first peak 112 and the second peak 111 is located between 15% and 30% of the peak value of the second peak 111, that is, a spectral intensity of the trough 114 is located between 15% and 30% of the spectral intensity (i.e., the maximum value of the spectral intensity) of the second peak 111. The trough value of the trough 114 provided by the present embodiment is greater than 15% of the peak value of the second peak 111 such that the spectrum at 10%-15% of the maximum spectral intensity is a continuous spectrum, and the present embodiment includes but is not limited thereto.

For example, as illustrated by FIG. 2, a red wave band of the emission spectrum includes a third peak 113, and a peak wavelength of the third peak 113 is between 610 nm and 624 nm.

For example, a peak value of the first peak 112 is greater than that of the third peak 113, and a ratio of the peak value of the first peak 112 to the peak value of the third peak 113 is greater than 1.5:1, i.e., the peak value of the first peak 112 is higher than 50% of the peak value of the third peak 113. In the present embodiment, because a wavelength difference between a peak wavelength of the third peak 113 and a peak wavelength of the first peak 112 is less than 70 nm, that is, λ2 illustrated in FIG. 2 is less than 70 nm. Therefore, the third peak 113 in FIG. 2 does not appear to be obvious.

Under the premise of a certain quantum efficiency, the current efficiency of the display panel can be changed by adjusting a ratio between the spectral intensity values of the blue, green and red light emitted by the organic light emitting diode display panel.

For example, under the premise of a certain quantum efficiency, an organic light emitting diode display panel having spectral characteristics as illustrated by FIG. 2 has both high current efficiency and high color temperature. Herein, the color temperature is the most common indicator of the spectral quality of a light source. Upon a black body being heated to a temperature and color of light emitted by the black body being the same as color of light emitted by a certain light source, the temperature of the black body is called a temperature of the color of the light source, referred to as a color temperature.

For example, the organic light emitting diode display panel having the spectral characteristics as illustrated by FIG. 2 has a quantum efficiency of 100%, a current efficiency of 100%, and a color temperature of 9200 K. The present embodiment includes but is not limited thereto.

As seen, by the combination of a light emitting layer having a special spectral design and a color filter layer having a special spectral setting, the organic light emitting diode display panel provided by the present embodiment not only can improve the luminous efficiency of the white pixels in the organic light emitting diode display panel (WOLED) (so as to reduce the overall power consumption of the display panel), so as to make the display panel have a suitable white color temperature, but also can guarantee that the light transmitted from the color filter layer has wide color gamut. Therefore, the organic light emitting diode display panel provided by the present embodiment can simultaneously have wide color gamut and low power consumption.

For example, as illustrated by FIG. 1, the light emitting layer 110 provided by the present embodiment includes three laminated layers in a direction perpendicular to the base substrate 100, a side of the light emitting layer 110 having the three laminated layers away from the base substrate 100 is provided with a first electrode 130, a side of the light emitting layer 110 close to the base substrate 100 is provided with a second electrode 140. The three laminated layers in the present embodiment are a series stack structure, such that the light emitting diodes provided by the present embodiment are organic light emitting diodes of a series type, and the three laminated layers in series share the first electrode 130 and the second electrode 140.

For example, the first electrode 130 may be a cathode layer, and the cathode layer serves as a connection layer of a negative voltage of the organic light emitting diode display panel, and has relatively good electrical conductivity and a lower work function value.

For example, the second electrode 140 may be an anode layer, and the anode layer serves as a connection layer for a positive voltage of the organic light emitting diode display panel, and has relatively good electrical conductivity and a higher work function value.

For example, as illustrated by FIG. 1, the red pixel 201, the green pixel 202, the blue pixel 203, and the white pixel 204 in the organic light emitting diode display panel respectively correspond to a first sub-electrode 141, a second sub-electrode 142, a third sub-electrode 143, and a fourth sub-electrode 144 of the second electrode 140.

For example, as illustrated by FIG. 1, the three laminated layers in the light emitting layer 110 may include a first blue light emitting layer 115, a red and green light emitting layer 116, and a second blue light emitting layer 117, and the present embodiment includes but is not limited thereto.

For example, the first blue light emitting layer 115 has a thickness of 150 to 300 nm, the red and green light emitting layer 116 has a thickness of 60 to 100 nm, and the second blue light emitting layer 117 has a thickness of 100 to 200 nm.

For example, the first blue light emitting layer 115 may have a thickness of 150-180 nm, or 210-230 nm, etc., which is not limited in the present embodiment.

For example, the red and green light emitting layer 116 may have a thickness of 60-70 nm, or 80-90 nm, etc., which is not limited in the present embodiment.

For example, the second blue light emitting layer 117 may have a thickness of 120-150 nm, or 170-190 nm, etc., which is not limited in the present embodiment.

For example, in the present embodiment, the organic light emitting material of the first blue light emitting layer 115 and the second blue light emitting layer 117 includes a fluorescent material, and the organic light emitting material of the red and green light emitting layer 116 includes a phosphorescent material, the present embodiment includes but is not limited thereto. The red and green light emitting layer 116 refers to that the light emitting layer includes a red light emitting material and a green light emitting material, and the light emitted by the green light emitting material can be referred to as yellow-green light (also referred to as yellow light). The present embodiment includes but is not limited thereto.

For example, the above-mentioned fluorescent material or phosphorescent material may adopt a doping system, that is, a light emitting material which can be obtained by mixing a doping material in a host light emitting material.

For example, the host light emitting material may be selected from the group consisting of a metal complex material, an anthracene derivative, an aromatic diamine compound, a triphenylamine compound, an aromatic triamine compound, a biphenyldiamine derivative, and a triarylamine polymer. The present embodiment includes but is not limited thereto.

For example, the fluorescent material or the doping material may be selected from the group consisting of coumarin dye (coumarin 6, C-545T), perylene and tetra (t-butyl)-perylene (TBP) which is a derivative of perylene, quinacridone (DMQA), and 4-(dinitrile methylene)-2-methyl-6-(4-dimethylamino-styrene)-4H-pyran (DCM) series. The present embodiment includes but is not limited thereto. The phosphorescent material or the doping material may include a metal complex luminescent material based on Ir, Pt, Ru, Cu, etc., such as: FIRpic, Fir6, FirN4, FIrtaz, Ir(ppy)$_3$, Ir(ppy)$_2$(acac), PtOEP, (btp)$_2$Iracac, Ir(piq)$_2$(acac) or (MDQ)$_2$Iracac, etc. The present embodiment includes but is not limited thereto. In addition, the luminescent material may also include a doped co-host material.

It should be noted that, FIG. 1 only schematically illustrates that the organic light emitting diode display panel is an organic light emitting diode display panel having a series type of three laminated layers, the three laminated layers only illustrate the light emitting layers, and the laminated layers which are connected in series include other functional layers.

For example, a side of the first blue light emitting layer 115 away from the base substrate 100 is further provided with a functional layer for transmitting and injecting electrons into the first blue light emitting layer 115, such as a first electron transport layer. A side of the light emitting layer 115 close to the base substrate 100 is further provided with a functional layer for transmitting and injecting holes into the first blue light emitting layer 115, such as a first hole transport layer. In this way, the injected electrons and holes are combined with each other in the first blue light emitting layer 115 to form excitons, and the excitons transfer energy to the organic light emitting molecules in the first blue light emitting layer 115, and the electrons of the organic light emitting molecules are excited to jump from a ground state to an excited state, and the electrons in the excited state is deactivated by radiation to generate photons and emit blue light. The present embodiment includes but is not limited thereto. The first blue light emitting layer 115 and at least one corresponding functional layer constitute a first light emitting unit.

Similarly, for example, the red and green light emitting layer 116 and the second blue light emitting layer 117 may each include a corresponding functional layer on a side facing the base substrate 100 and a side away from the base substrate 100, and the present embodiment includes but is not limited thereto.

For example, the red and green light emitting layer 116 and at least one corresponding functional layer constitute a second light emitting unit, the second blue light emitting layer 117 and at least one corresponding functional layer constitute a third light emitting unit. The three light emitting units are connected by two intermediate connection layers, which not only have the function of connecting the light emitting units, but also have the function of generation, transmission of electric charges and injecting carriers into the functional layers.

In the present embodiment, film thicknesses of the functional layers can be adjusted to control the spectral width, peak values of the peaks, and peak wavelengths of the peaks of the emission spectrum of the organic light emitting diode display panel. For example, the control of the spectral width, the peak values of the peaks, and the peak wavelengths of the peaks of the emission spectrum of the organic light emitting diode display panel can be achieved by adjusting a distance between the light emitting layer and the second electrode or a distance between the first electrode and the second electrode, and controlling characteristics of the host light emitting material, and a proportion or concentration of the mixed doping material in the light emitting material.

For example, the functional layers may include at least one selected from the group consisting of a hole transport layer, a hole injecting layer, a hole blocking layer, an electron transport layer, an electron injecting layer, and an electron blocking layer, which is not limited in the present embodiment.

For example, the hole injecting layer may be made of at least one selected from the group consisting of a triphenylamine compound, an P-type doped organic layer, and a polymer, which is not limited in the present embodiment.

For example, the hole transport layer may be made of at least one selected from the group consisting of an aromatic diamine compound, an aromatic triamine compound, a biphenyldiamine derivative, and a carbazole-based polymer, which is not limited in the present embodiment.

For example, the electron transport layer may be made of at least one selected from the group consisting of a phenanthroline derivative, an imidazole derivative, a metal complex, and an anthracene derivative, which is not limited in the present embodiment.

For example, the electron injecting layer may be made of at least one selected from the group consisting of an alkali metal oxide and an alkali metal fluoride, which is not limited in the present embodiment.

For example, a comparison table of characteristics of an organic light emitting diode display panel using the technical solution provided by an embodiment of the present disclosure and an organic light emitting diode display panel using a conventional technical solution is provided as follows:

| Parameters | Conventional technical solution | Technical solution of the present application |
|---|---|---|
| CIE x, y_R | (0.637, 0.336) | (0.663, 0.331) |
| CIE x, y_G | (0.216, 0.693) | (0.285, 0.668) |
| CIE x, y_B | (0.144, 0.064) | (0.142, 0.053) |
| Color Gamut @CIE1931 | 84% DCI-P3 coverage | 92% DCI-P3 coverage |
| White Power | 210 watt | 160 watt |
| Worst Power | 427 watt | 403 watt |

For example, it can be seen from the comparison table that, compared with a conventional technical solution, chromaticity coordinates of red light (R), green light (G), and blue light (B) in the present embodiment are changed, thus, the relative position of color gamut of the RGB primary colors to the CIE 1931 xy chromaticity diagram in the present embodiment is also changed with respect to that in the conventional technical solution. As can be seen from the comparison table, the color gamut of the RGB primary colors in the conventional technical solution has a coverage of 84% in the DCI-P3 color gamut standard, and the color gamut of the RGB primary colors in the present embodiment of the present disclosure has a coverage of 92% in the DCI-P3 color gamut standard. Therefore, it can be seen from the experimental results that the organic light emitting diode display panel provided by the embodiment of the present disclosure has wider color gamut than that of the conventional technical solution. On the other hand, upon the display panel displaying a white image, power consumption of the white image (White Power) in the conventional technical solution is 210 watts, and the power consumption of the white image in the embodiment of the present disclosure is 160 watts; in comparison, the display panel provided by the embodiment has lower white power consumption. Upon the display panel displaying an image with the maximum power consumption (for example, a purple image), the maximum power consumption (Worst Power) in the conventional technical solution is 427 watts, and the maximum power consumption in the embodiment of the present disclosure is 403 watts; in comparison, the display panel provided by the embodiment of the present disclosure has lower power consumption. Therefore, the organic light emitting diode display panel provided by the embodiment of the present disclosure can simultaneously have wide color gamut and low power consumption.

Another embodiment of the present disclosure provides a manufacturing method of an organic light emitting diode display panel. The manufacturing method of the organic light emitting diode display panel mainly includes: forming a light emitting layer on the base substrate. A spectral width at 10%-15% of a maximum spectral intensity of an emission spectrum of the light emitting layer is not less than 200 nm, that is, a wavelength interval between two points of the spectrum line which respectively correspond to 10%-15% of the maximum spectral intensity of the spectrum line is greater than 200 nm. The spectrum emitted by the light emitting layer provided by the present embodiment has wide spectral characteristics, so that the organic light emitting diode display panel including the light emitting layer has wide color gamut A yellow-green wave band of the emission spectrum of the light emitting layer provided by the present embodiment includes at least one peak located between 550 nm-562 nm.

For example, the present embodiment is described by taking a case where the yellow-green wave band of the emission spectrum includes only one peak located between 550 nm-562 nm. A wavelength corresponding to the position of the peak is close to a wavelength corresponding to a peak of the human visual curve. Therefore, green light emitted by the organic light emitting diode display panel can have higher luminous efficiency.

For example, the peak wavelength of the peak at the maximum spectral intensity of the emission spectrum of the light emitting layer provided by the present embodiment is not greater than 456 nm, that is, the peak at the maximum spectral intensity in the emission spectrum is located in a wave band of deep blue light.

For example, the emission spectrum of the light emitting layer provided by the present embodiment includes at least three peaks. The present embodiment is described by taking a case where the emission spectrum includes three peaks as an example, but is not limited thereto.

For example, the light emitting layer provided in the present embodiment includes three laminated layers in a direction perpendicular to the base substrate, and the three laminated layers may include a first blue light emitting layer, a red and green light emitting layer, and a second blue light emitting layer. The present embodiment includes but is not limited thereto.

For example, the manufacturing method of an organic light emitting diode display panel further includes: forming a color filter layer on a side of the light emitting layer away from the base substrate. The color filter layer is located on a light exit side of the light emitting diode display panel. A structure of the organic light emitting diode display panel of the present embodiment is a structure including a white organic light emitting diode (WOLED) and a color filter layer (CF, Color Filter). The color filter layer includes color filter elements of at least three colors. The present embodiment is described by taking a case where the color filter layer includes color filter elements of three colors as an example, but is not limited thereto.

For example, the present embodiment is described by taking a case where the organic light emitting diode display panel includes a red pixel, a green pixel, a blue pixel, and a white pixel as an example, but is not limited thereto, pixels of other colors may also be included.

For example the color filter layer in the present embodiment includes a red color filter element, a green color filter element, and a blue color filter element. The color filter elements of the three colors are respectively disposed in the red pixel, the green pixel, and the blue pixel. The present embodiment includes but is not limited thereto.

For example, the red color filter element is configured to transmit only light having a wavelength greater than 580 nm, and the transmittance for light having a wavelength of 595 nm is greater than 50%.

The organic light emitting diode display panel manufactured by the manufacturing method of the organic light emitting diode display panel provided by the present embodiment has wider color gamut and lower power consumption than the conventional technical solution. Therefore, the organic light emitting diode display panel manufactured by the manufacturing method of the organic light emitting diode display panel provided by the present embodiment can simultaneously have wide color gamut and low power consumption.

Another embodiment of the present disclosure provides a display device including the organic light emitting diode display panel provided by any one of the embodiments of the present disclosure. Therefore, the display device including the abovementioned organic light emitting diode display panel can simultaneously have wide color gamut and low power consumption.

For example, the display device may be an organic light emitting diode (organic light emitting diode) display device, and any products or components having a display function and including the display device, such as: a television, a digital camera, a mobile phone, a watch, a tablet, a notebook computer, and a navigator. The present embodiment is not limited thereto.

The following points should to be explained:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. An organic light emitting diode display panel, comprising:
   a base substrate; and
   a light emitting layer on the base substrate,
   wherein a spectral width at 10%-15% of a maximum spectral intensity of an emission spectrum of the light emitting layer is not less than 200 nm, and a yellow-green wave band of the emission spectrum comprises at least one peak located between 550 nm-562 nm;
   the organic light emitting diode display panel further comprising:
   a color filter layer on a side of the light emitting layer away from the base substrate and on a light exit side of the light emitting layer, and comprising color filter elements of at least three colors, wherein a color filter element of one color is configured to only transmit light having a wavelength greater than 580 nm, and have a transmittance greater than 50% for light having a wavelength of 595 nm;
   the yellow-green wave band of the emission spectrum only comprises one peak located between 550 nm-562 nm, and the peak located between 550 nm-562 nm is a first peak;
   a peak at the maximum spectral intensity of the emission spectrum is a second peak, and a peak wavelength of the second peak is not greater than 456 nm.

2. The organic light emitting diode display panel according to claim 1, wherein the emission spectrum comprises at least three peaks.

3. The organic light emitting diode display panel according to claim 1, wherein a trough value of a trough between the first peak and the second peak is between 15%-30% of a peak value of the second peak.

4. The organic light emitting diode display panel according to claim 1, wherein a red wave band of the emission spectrum comprises a third peak, and a peak wavelength of the third peak is between 610 nm-624 nm.

5. The organic light emitting diode display panel according to claim 4, wherein a ratio of a peak value of the first peak to a peak value of the third peak is greater than 1.5:1, and a wavelength difference between the peak wavelength of the third peak and a peak wavelength of the first peak is less than 70 nm.

6. The organic light emitting diode display panel according to claim 1, wherein the light emitting layer comprises three laminated layers.

7. The organic light emitting diode display panel according to claim 6, wherein the three laminated layers comprise a first blue light emitting layer, a red and green light emitting layer, and a second blue light emitting layer.

8. The organic light emitting diode display panel according to claim 7, wherein the first blue light emitting layer has a thickness of 150-300 nm, and the red and green light emitting layer has a thickness of 60-100 nm, and the second blue light emitting layer has a thickness of 100-200 nm.

9. The organic light emitting diode display panel according to claim 7, wherein the first blue light emitting layer and the second blue light emitting layer each comprise a fluorescent material, and the red and green light emitting layer comprises a phosphorescent material.

10. The organic light emitting diode display panel according to claim 1, wherein the light emitting layer is a white light emitting layer.

11. A display device, comprising the organic light emitting diode display panel according to claim 1.

12. A manufacturing method of an organic light emitting diode display panel, comprising:
forming a light emitting layer on a base substrate,
wherein a spectral width at 10%-15% of a maximum spectral intensity of an emission spectrum of the light emitting layer is not less than 200 nm, and a yellow-green wave band of the emission spectrum comprises at least one peak located between 550 nm-562 nm;
the manufacturing method of the organic light emitting diode display panel further comprising:
forming a color filter layer on a side of the light emitting layer away from the base substrate, the color filter layer being on a light exit side of the light emitting layer and comprising color filter elements of at least three colors, wherein a color filter element of one color is configured to only transmit light having a wavelength greater than 580 nm, and have a transmittance greater than 50% for light having a wavelength of 595 nm;
the yellow-green wave band of the emission spectrum only comprises one peak located between 550 nm-562 nm, and the peak located between 550 nm-562 nm is a first peak;
a peak at the maximum spectral intensity of the emission spectrum is a second peak, and a peak wavelength of the second peak is not greater than 456 nm.

13. An organic light emitting diode display panel, comprising:
a base substrate; and
a light emitting layer on the base substrate,
wherein a spectral width at 10%-15% of a maximum spectral intensity of an emission spectrum of the light emitting layer is not less than 200 nm, and a yellow-green wave band of the emission spectrum comprises at least one peak located between 550 nm-562 nm;
the light emitting layer comprises three laminated layers, the three laminated layers comprise a first blue light emitting layer, a red and green light emitting layer, and a second blue light emitting layer.

14. The organic light emitting diode display panel according to claim 13, wherein the first blue light emitting layer has a thickness of 150-300 nm, and the red and green light emitting layer has a thickness of 60-100 nm, and the second blue light emitting layer has a thickness of 100-200 nm.

15. The organic light emitting diode display panel according to claim 13, wherein the first blue light emitting layer and the second blue light emitting layer each comprise a fluorescent material, and the red and green light emitting layer comprises a phosphorescent material.

16. The organic light emitting diode display panel according to claim 1, wherein the organic light emitting diode display panel comprises a red pixel, a green pixel, a blue pixel, and a white pixel, and the color filter elements of the at least three colors comprise a red color filter element, a green color filter element, and a blue color filter element, which are disposed in the red pixel, the green pixel, and the blue pixel, respectively.

* * * * *